(12) United States Patent
Kurtin

(10) Patent No.: US 7,274,998 B2
(45) Date of Patent: Sep. 25, 2007

(54) NEAR-FIELD PHOTO-LITHOGRAPHY USING NANO LIGHT EMITTING DIODES

(75) Inventor: Juanita Kurtin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 11/241,182

(22) Filed: Sep. 30, 2005

(65) Prior Publication Data

US 2007/0078613 A1 Apr. 5, 2007

(51) Int. Cl.
*G01R 15/00* (2006.01)
*G02B 9/00* (2006.01)

(52) U.S. Cl. .......................................... 702/57; 359/738

(58) Field of Classification Search ................. 702/57, 702/40; 977/949, 762, 849, 851, 858, 859, 977/862, 881, 860; 250/201.3, 203.2, 552, 250/553; 356/310; 716/19, 21; 359/738
See application file for complete search history.

(56) References Cited

U.S. PATENT DOCUMENTS

| | | | | |
|---|---|---|---|---|
| 5,618,760 | A * | 4/1997 | Soh et al. | 438/703 |
| 5,666,190 | A * | 9/1997 | Quate et al. | 355/71 |
| 5,789,742 | A * | 8/1998 | Wolff | 250/227.11 |
| 5,973,316 | A * | 10/1999 | Ebbesen et al. | 250/216 |
| 6,052,238 | A * | 4/2000 | Ebbesen et al. | 359/738 |
| 7,067,098 | B2 * | 6/2006 | Colbert et al. | 423/447.1 |
| 2002/0171029 | A1 * | 11/2002 | Wolff | 250/201.3 |

OTHER PUBLICATIONS

Abdi et al., Application of Carbon Nanotubes in Nano-Lithography and Nano-Electronics, Jun. 20-22, 2005, Device research Conference Digest, vol. 1, pp. 115-116.*
Kawazoe et al., Nano-Optical CVD and Nanophotolithography Using an Optical Near-Field Nonresonant to Electronic Transition, 2003 IEEE, pp. 561-564.*
Lo et al., Near-Field Photolithography by a Fiber Probe, 2001 IEEE, pp. 36-39.*
Yonemitsu et al., Nanofabrication Using Nonadiabatic Near-Field Photolithography, Jul. 2005, proceedings of 2005 5th IEEE Conference on Nanotechnology.*
Pieter G. Kik, et al., "Plasmon printing—a new approach to near-field lithography", Thomas J. Watson Lab. of Applied Physics, Cal. Inst. of Tech., Pasadena, CA 91125, 2002.
Yu Huang, et al., "Integrated nanoscale electronics and optoelectronics: Exploring nanoscale sciend and technology through semiconductor nanowires", Pure Appl. Chem., vol. 76, pp. 2051-2099, 2004.
Yu Huang, et al., "Nanowires for Integrated Multicolor Nanophotonics", small, vol. 1, No. 1 pp. 142-147, 2005.
Thomas M. Orlando, et al., "Three-Dimensional Nanoengineered Assemblies", Materials Research Society Symposium Proceedings, vol. 739, pp. 42-53, 2003.

* cited by examiner

*Primary Examiner*—Donald E. McElheny, Jr.
*Assistant Examiner*—Toan M. Le
(74) *Attorney, Agent, or Firm*—Blakely, Sokoloff, Taylor & Zafman LLP

(57) ABSTRACT

An embodiment of the present invention is a technique to pattern features. An array of nanowires is placed at a distance to a resist layer. The array forms a plurality of light emitting diodes (LEDs). The distance corresponds to a near-field region of the light emitted by the LEDs with respect to the resist layer. A control circuit controls the LEDs to emit the light to pattern a feature in the resist layer.

20 Claims, 4 Drawing Sheets

NEAR-FIELD PHOTO-LITHOGRAPHY USING NANO LIGHT EMITTING DIODES

BACKGROUND

1. Field of the Invention

Embodiments of the invention relate to the field of semiconductor fabrication, and more specifically, to near-field photo-lithography.

2. Description of Related Art

Lithography is a technique to print the intricate patterns that define integrated circuits onto a semiconductor wafer. Modern semiconductor fabrication technologies often require feature size of circuit elements at an ultra high resolution range at the nanometer (nm) level.

With lithography using far field optics, the smallest feature that can be patterned is just under half of the wavelength of the light being used. Current 193 nm lithography cannot produce features below 80 nm. Extreme Ultraviolet (EUV) lithography uses EUV radiation with a wavelength of 10 to 14 nanometer (nm). However, EUV lithographic equipment and process are expensive. Nanoscale light emitting diodes (nanoLEDs) have been proposed for assembling integrated photonic devices or electronic logic gates but not in near-field photo-lithography. Techniques using plasmon printing and evanescent fields have been suggested as a new approach for near-field lithography. None of these techniques provides flexibility, programmability, and controllability in patterning nanometer-sized features in a resist.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to pattern features. An array of nanowires is placed at a distance to a resist layer. The array forms a plurality of light emitting diodes (LEDs). The distance corresponds to a near-field region of the LEDs with respect to the resist layer. A control circuit controls the LEDs to emit light to pattern a feature in the resist layer.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to pattern features in a resist using near-field nanoLED lithography. Light in the near-field region from an array of nanometer-sized light-emitting devices is used to pattern nanometer-sized features in the resist, resulting in feature dimensions much smaller than techniques using far-field optics. The technique is suitable to pattern features with small dimensions such as contact and via. By individually controlling the light-emitting devices, more complex patterns may also be created.

Figure 1A:
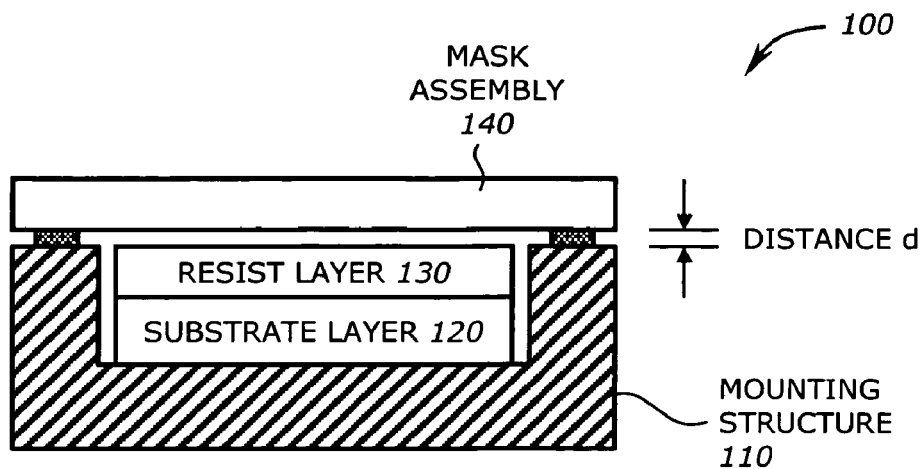
FIG. 1A is a diagram illustrating a system in which one embodiment of the invention can be practiced.

FIG. 1A is a diagram illustrating a system 100 in which one embodiment of the invention can be practiced. The system 100 includes a mounting structure 110, a substrate 120, a resist layer 130, and a mask assembly 140. The system 100 is shown to illustrate patterning of features using a near-field photo-lithography technique. Subsequent processes after patterning may be carried out using traditional techniques in photo-lithography.

The mounting structure 110 provides mechanical support for the substrate 120 and the mask assembly 140. It may not be necessary and is optional if the substrate 120 and the mask assembly 140 may be secured. The substrate 130 is any substrate as part of a wafer for semiconductor fabrication. For example, it may be silicon or gallium arsenide. Typically, the substrate surface is cleaned to remove any traces of contamination such as dust, organic, ionic and metallic compounds. The substrate 120 or the wafer may be subject to other processes, such as priming, to enhance the adhesion of the resist layer 130 to the surface of the substrate 120.

The resist layer 130 is deposited to the surface of the substrate 120 using a suitable technique such as spin coating machine. The resist layer 130 is typically spread evenly on the substrate 120. Any excess is removed. The thickness of the resist layer 130 depends on the application. The resist layer 130 and the substrate 120 are typically pre-baked to evaporate the resist solvent and to partially solidify the resist material.

The mask assembly 140 provides a mask to pattern the features on the resist layer 130 using near-field optics. It is placed in close proximity to the resist layer 130 at a distance d. The distance d may be adjusted to provide a suitable exposure level that may affect the desired feature size. It may range from zero (i.e., the mask assembly 140 is in direct contact with the resist layer 130) to tens of nm.

Figure 1B:
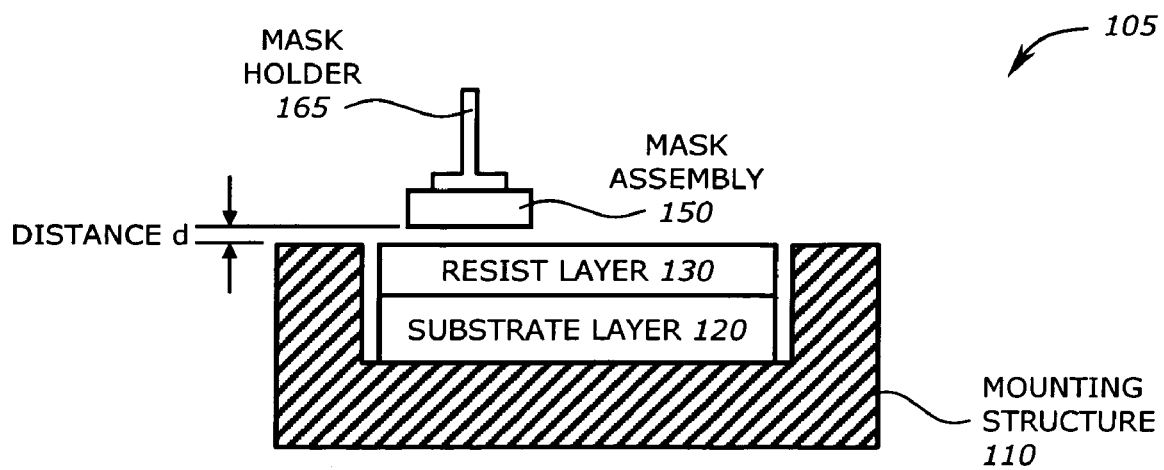
FIG. 1B is a diagram illustrating a system having a mask assembly partially covering the wafer according to one embodiment of the invention.

FIG. 1B is a diagram illustrating a system 105 having a mask assembly partially covering the wafer according to one embodiment of the invention.

The system 105 is essentially similar to the system 100 shown in FIG. 1A. It includes the mounting structure 110, a wafer including the substrate 120 and the resist layer 130, a mask assembly 150, and a mask assembly holder 160.

The mounting structure 110, the substrate 120 and the resist layer 130 are similar to those shown in FIG. 1A. The mask assembly 150 is also similar to the mask assembly 140 shown in FIG. 1 except that it partially cover the resist layer 130. It may provide mask to pattern a single die or a small number of dies. The mask assembly holder 160 holds or secures the mask assembly 150 so that it is positioned in close proximity to the resist layer 130 at the distance d. The mask assembly holder 160 may be connected to a mechanical positioning mechanism such as a stepping mechanism. The mask assembly 150 may be stepped in the x and y directions one die at a time. The mechanical movement may be like a rastering technique to move in increments to cover a portion or an entire wafer.

Figure 2:
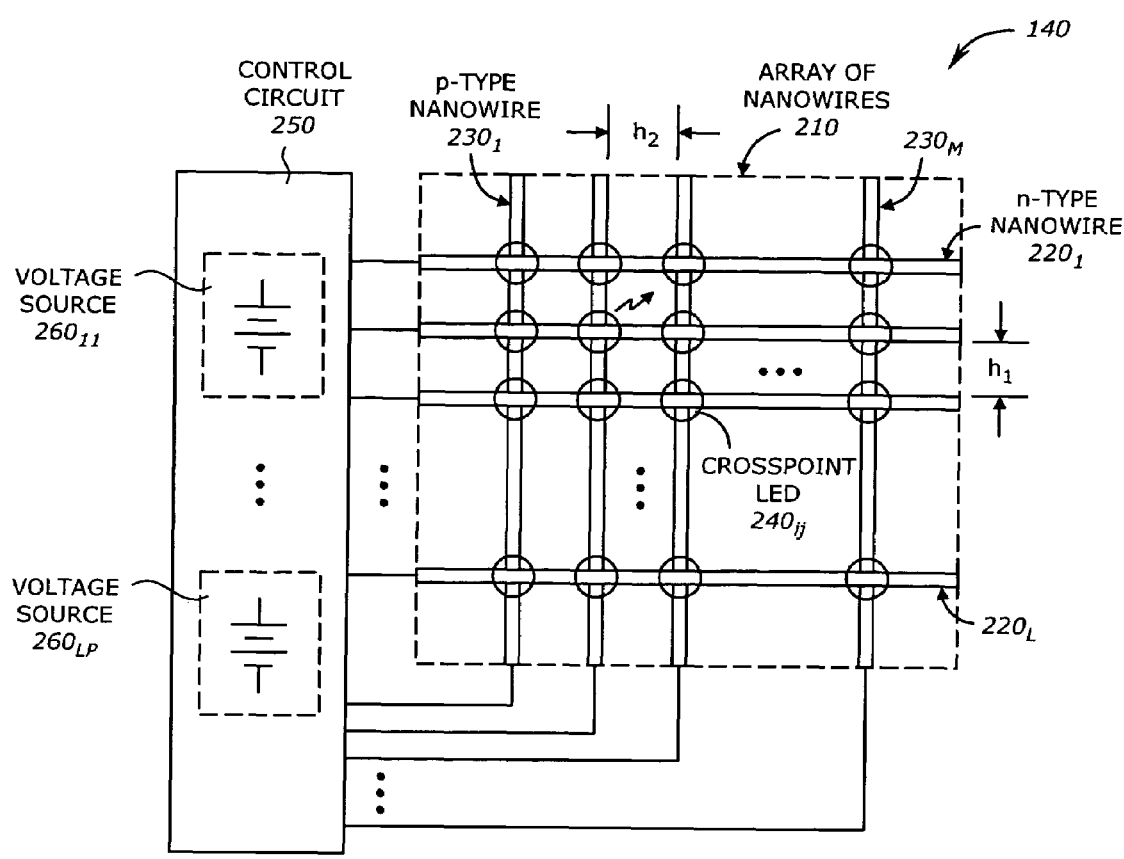
FIG. 2 is a diagram illustrating a mask assembly according to one embodiment of the invention.

FIG. 2 is a diagram illustrating a mask assembly 140/150 according to one embodiment of the invention. The mask assembly 140/150 includes an array 210 of nanowires (NWs) and a control circuit 250. Nanowires are defined to be wires of any material, either freestanding or etched from a substrate, where the diameter of the wire may be a fraction of a nanometer to hundreds of nanometers. The nanowires in this assembly would ideally be on the very small end of the range.

The array 210 of NWs may be a crossbar array of NWs. It includes a first set of NWs having L NWs $220_1$ to $220_L$ arranged in parallel in a first direction and a second set of NWs having M NWs $230_1$ to $230_M$ arranged in parallel in a second direction. The L NWs $220_1$ to $220_L$ may be made of n-type material having a direct bandgap with efficient light emission. The n-type material may be any compound in Group III-V and II-VI materials. Examples of these materials are Gallium Nitride (GaN), Indium Phosphide (InP), Cadmium Sulfide (CdS), Cadmium Selenide (CdSe), Cadmium Sulfur Selenide (CdSSe), etc. The M NWs $230_1$ to $230_M$ may be made, of p-type material having indirect bandgap with inefficient light emission. Examples of the p-type material include Silicon (Si). The indirect bandgap p-type material is used as a passive optical component. Silicon is a good material to be used because of its well-defined properties. The semiconductor NWs may be synthesized in a single crystal form with all the key parameters under control. These key parameters may include chemical composition, diameter, length, and doping or electronic properties.

The array 210 of NWs is formed by first depositing the L NWs $220_1$ to $220_L$ aligned in close proximity to the resist layer 130. The L NWs $220_1$ to $220_L$ may be parallel and located at a distance $h_1$ apart. The separation distance $h_1$ may be different or the same between pairs of NWs. Non-uniform separation distances may provide precise locations of the desired features. Then, the M NWs $230_1$ to $230_M$ are deposited in the second direction on the such that the two sets cross with each other at cross points $240_{ij}$ where i=1, . . . , L, and j=1, . . . , M. The second direction may be in any angle with respect to the first direction. In one embodiment, the second direction is orthogonal to the first direction, i.e., the angle formed by the NWs in these two sets is approximately 90°. The M NWs $230_1$ to $230_M$ may be parallel and located at a distance $h_2$ apart. The separation distance $h_2$ may be different or the same between pairs of NWs. As in the L NWs $220_1$ to $220_L$, non-uniform separation distances may provide precise locations of the desired features. The cross points $240_{ij}$ form nano light emitting diodes (nanoLEDs) that emit light when they are forward biased with appropriate voltages. Each nanoLED emits light characteristic of the corresponding n-type material when the applied forward bias exceeds the bandgap. The wavelength of the emitted light depends on the n-type material. For example, the emission wavelength is 365 nm for GaN. The light source is internal to the mask assembly and therefore the feature patterning is efficient.

The assembly or deposition of the NWs may be performed using a number of methods. One technique is to use electrical field-directed assembly. In this technique, the electrical fields are applied to attract and align the NWs. Pairs of diametrically opposed electrodes may be used to generate electrical fields. The direction of the generated electrical field may be changed with sequential NW solutions so that the alignment may take place in a layer-by-layer manner to produce crossed NW junctions. Another technique is to use fluidic flow-directed assembly. In this technique, NWs may be aligned by passing a suspension of NWs through microfluidic channel structures. An example of such structures may be formed between a poly(dimethylsiloxane) (PDMS) mold and a flat substrate. The fluidic flow-directed assembly technique may allow for the directed assembly of complex structures by controlling the angles between flow directions in sequential assembly phases. Any other techniques to align the NWs may be used as is known by one of ordinary skill in the art. In addition to these methods, NWs do not necessarily have to start as free-standing, they may be stamped in precisely aligned arrays onto a substrate. In this case, very good control over alignment may be achieved.

The control circuit 250 is connected to the array 210 of the NWs to control the LEDs to emit light to pattern a feature in the resist layer. The control circuit 250 includes a number of voltage sources $260_{11}$ to $260_{LP}$ that are used to forward bias the nanoLEDs in the array 210. Since a nanoLED $240_{ij}$ is located at the intersection of the n-type NW $220_i$ and the p-type NW $230_j$, its location may be individually addressable. The location of the feature patterned in the resist layer 130 that corresponds to the nanoLED $240_{ij}$ is therefore individually addressable. Accordingly, the array 210 of NWs may act as a programmable mask where the feature locations are individually addressable by applying the appropriate forward bias voltages to the selected locations. For example, a voltage source $260_{ij}$ connected to the NW $220_i$ and the NW $230_j$ controls the nanoLED $240_{ij}$. The number of voltage sources to be activated to forward bias the nanoLEDs depends on the number and structure of the features to be patterned. Typically, this number is much less than the total number of cross points in the array 210 of NWs.

The emission intensity of the nanoLED $240_{ij}$ increases with the applied forward bias voltage. Therefore, by controlling the amount of the applied forward bias voltage $260_{ij}$, the amount of exposure of the resist in the resist layer 130 may be controlled to achieve the desired feature size or processing time. In addition, the distance d between the mask assembly 140 and the resist layer 130 (FIG. 1) corresponds to a near-field region of the emitted light of the LEDs with respect to the resist layer 130. The resolution of the printed features on the resist layer 130 may be limited by the size of the NWs $220_1$ to $220_L$ and $230_1$ to $230_M$, the distance d, the forward bias voltage, and the ability to align the NWs in a crossed pattern. By tuning these parameters, a very high resolution for the feature pattern may be achieved. Holes such as contact or via may be pattern with size at the nanometer level. In addition, if the NWs are placed very densely, a line pattern may be obtained with very fine resolution. Additionally, if a more complex feature pattern is desired, the NWs may be aligned using any of the assembly methods to form a corresponding complex nanoLEDs. Accordingly, an arbitrarily complex pattern may be created.

Knowing the bandgap $E_g$ of the n-type NW material, appropriate forward bias voltages may be applied. The value of the forward bias voltage may be slightly above the value of the corresponding bandgap. Table 1 shows the values of the bandgap $E_g$ for some representative n-type materials and the corresponding values of the forward bias voltage $V_f$. As discussed above the forward bias voltage $V_f$ for the individual voltage sources $260_{ij}$ may be varied according to the desired resolution of the resulting feature pattern.

TABLE 1

| NW material | $E_g$ (eV) | $V_f$ (V) |
|---|---|---|
| GaN | 3.36 | 3.5 |
| CdS | 2.42 | 2.5 |
| $CdS_{0.5}Se_{0.5}$ | 2.06 | 2.25 |
| CdSe | 1.7 | 2.0 |
| InP | 1.35 | 1.5 |

Figure 3:
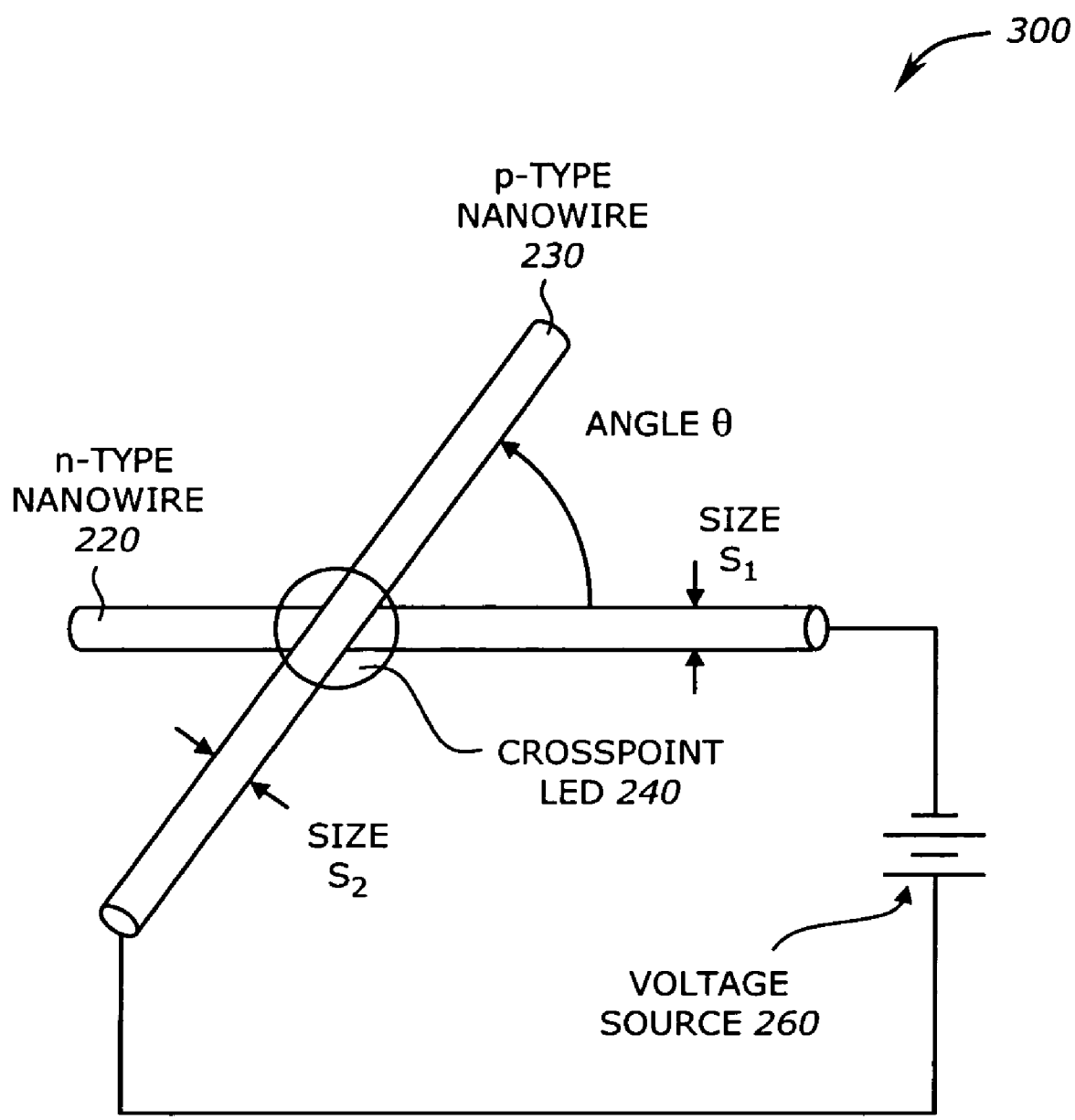
FIG. 3 is a diagram illustrating a nanoLED according to one embodiment of the invention.

FIG. 3 is a diagram illustrating a nanoLED 240 according to one embodiment of the invention. For clarity, all subscripts are dropped. The nanoLED 240 is formed at the intersection of the n-type NW 220 and the p-type NW 230.

The n-type NW 220 and p-type NW 230 have sizes $s_1$ and $s_2$, respectively, which may be the diameters of the respective NWs. The NWs may have different or same sizes among their group or different or same sizes between the two groups. In one embodiment, the NWs have the same size. The size $s_1$ or $s_2$ may range from a few nanometers to 10 nm.

The n-type NW 220 and the p-type NW 230 may cross at an angle θ. The angle θ may be selected to correspond to the overall geometry or pattern of the features to be printed. In one embodiment, the angle θ is approximately 90°. In other words, the n-type NW 220 and the p-type NW 230 are orthogonal to each other.

The n-type NW 220 and p-type NW 230 are connected to the negative and positive, respectively, polarities or terminals of the voltage source 260 in the control circuit 250. When the voltage source 260 is activated or is turned on, the nanoLED 240 is forward biased and emits light with controllable intensity. The light emission creates a feature pattern on the resist layer 130 through near-field optics such that the resolution of the feature may be extremely high to the nanometer level. The near-field optical power density may be in the order of 100 W/cm$^2$.

Figure 4:
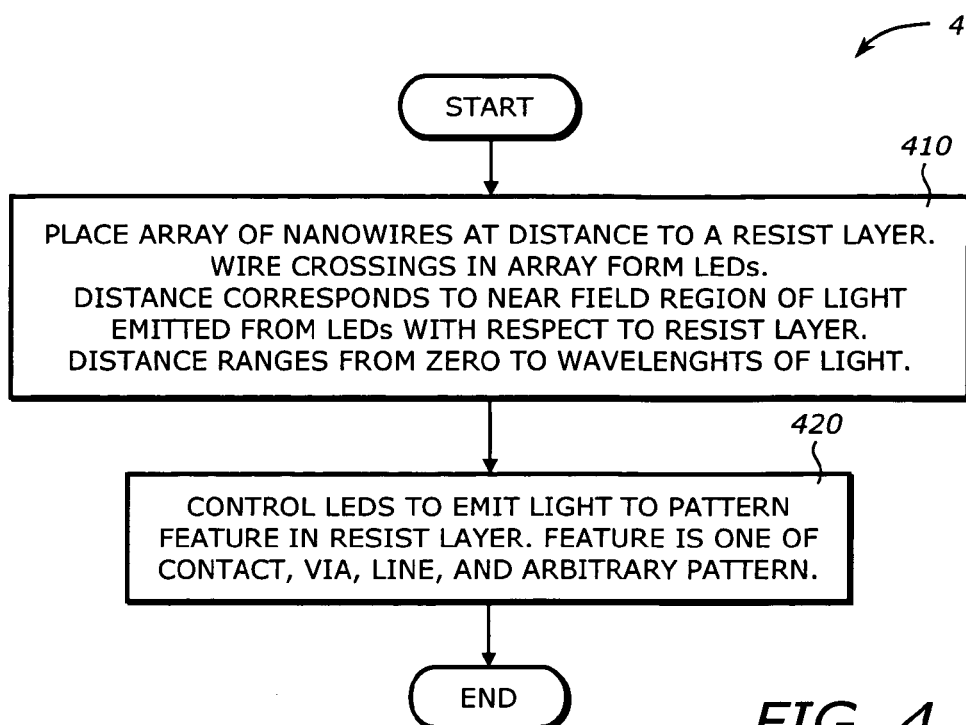
FIG. 4 is a flowchart illustrating a process to pattern features using nanoLEDs according to one embodiment of the invention.

FIG. 4 is a flowchart illustrating a process 400 to pattern features using nanoLEDs according to one embodiment of the invention.

Upon START, the process 400 places an array of NWs at a distance to a resist layer (Block 410). The wire crossings in the array form a number of nanoLEDs. The distance corresponds to a near-field region of the emitted light of the LEDs with respect to the resist layer and may range to zero to wavelengths of the light. For nanometer-sized features, the distance may range up to tens of nanometers. Next, the process 400 controls the nanoLEDs to emit light to pattern a feature in the resist layer (Block 420). The feature may be one of a contact, a via, a line, and an arbitrary pattern. The process 400 is then terminated.

Figure 5:
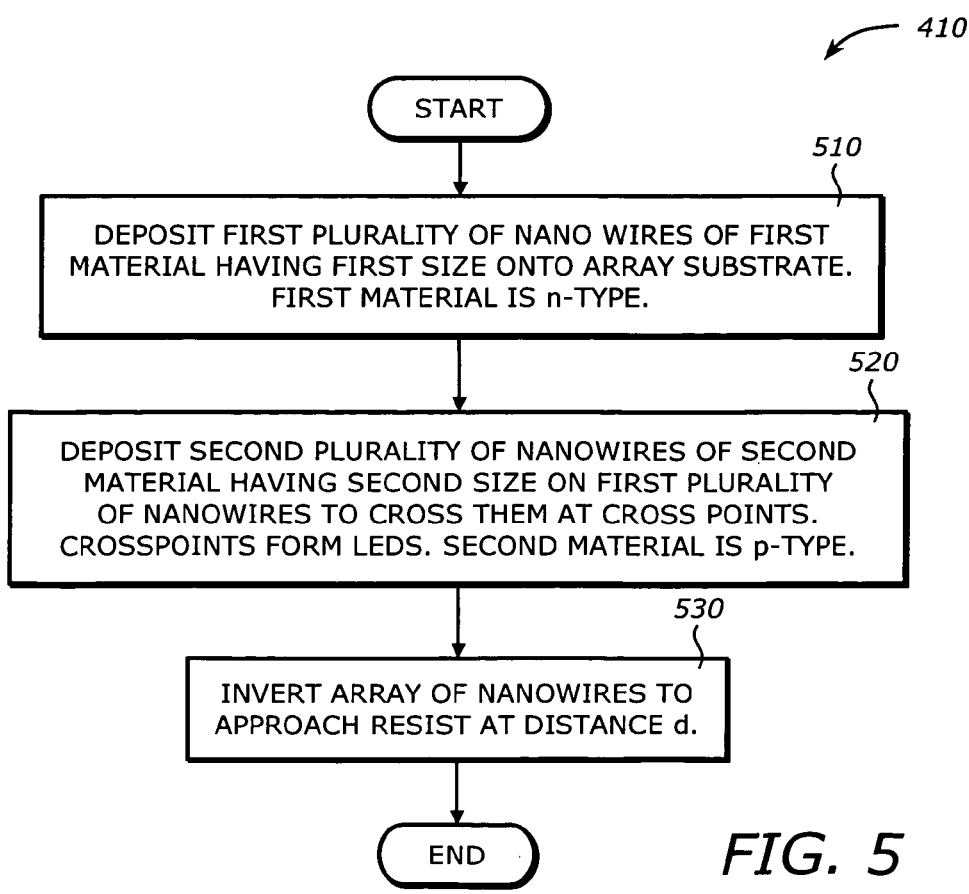
FIG. 5 is a flowchart illustrating a process to place array of nanowires according to one embodiment of the invention.

FIG. 5 is a flowchart illustrating the process 410 to place array of nanowires according to one embodiment of the invention.

Upon START, the process 410 deposits a first plurality of NWs of a first material having a first size on the array substrate (Block 510). The deposition of the NWs may be performed using electrical field-directed assembly or fluidic flow-directed assembly technique. The material of the first plurality of NWs is an p-type material. The distance may range to zero to tens of nanometers. Next, the process 410 deposits a second plurality of NWs of a second material having a second size on the first plurality of NWs to cross them at a number of cross points (Block 520). The deposition may be the second phase of the sequential procedure of the electrical field-directed assembly or fluidic flow-directed assembly technique. These cross points form the nanoLEDs and may emit light when a suitable forward bias voltage is applied. Then, the process 410 inverts the array of NWs formed by the first and second pluralities of NWs to approach the resist at a distance d (Block 530). The process 410 is then terminated.

An embodiment of the invention may provide much greater resolution capabilities to hole masks like contact and via, or an arbitrarily complex pattern. Additionally, if the crossbar array may be made very dense (e.g. nanowires crossing every 10-20 nm), the programmable nature of the mask may be uses as a response mechanism to alignment overlay errors or known patterning errors on the previous layer.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
    an array of nanowires placed at a distance to a resist layer, the array forming a plurality of light emitting diodes (LEDs), the distance corresponding to a near field region of light emitted by the LEDs with respect to the resist layer; and
    a control circuit coupled to the array to control the LEDs to emit the light to pattern a feature in the resist layer.

2. The apparatus of claim 1 wherein the array comprises:
    a first plurality of nanowires of a first material having a first size; and
    a second plurality of nanowires of a second material having a second size and crossing the first plurality of nanowires at cross points, the cross points forming the LEDs.

3. The apparatus of claim 2 wherein the control circuit comprises:
    a voltage source to forward bias one of the LEDs at a pre-determined location corresponding to the feature in the resist, the voltage source having a first terminal connected to one of the first plurality of the nanowires and a second terminal connected to one of the second plurality of the nanowires.

4. The apparatus of claim 2 wherein the feature is one of a contact, a via, a line, and an arbitrary pattern.

5. The apparatus of claim 3 wherein the distance ranges from zero to tens of nanometers.

6. The apparatus of claim 2 wherein the first material is an n-type material having a direct bandgap.

7. The apparatus of claim 6 wherein the second material is a p-type material having an indirect bandgap.

8. A method comprising:
    placing an array of nanowires at a distance to a resist layer, the array forming a plurality of light emitting diodes (LEDs), the distance corresponding to a near field region of light emitted by the LEDs with respect to the resist layer; and
    controlling the LEDs to emit the light to pattern a feature in the resist layer.

9. The method of claim 8 wherein placing the array comprises:
    depositing a first plurality of nanowires of a first material having a first size on a substrate; and
    depositing a second plurality of nanowires of a second material having a second size on the first plurality of nanowires to cross the first plurality of nanowires at cross points, the cross points forming the LEDs.

10. The method of claim 9 wherein the controlling comprises:

forwarding bias one of the LEDs at a pre-determined location corresponding to the feature in the resist using a voltage source, the voltage source having a first terminal connected to one of the first plurality of the nanowires and a second terminal connected to one of the second plurality of the nanowires.

11. The method of claim 8 wherein the controlling comprises:

controlling one of the LEDs to pattern the feature being one of a contact, a via, a line, and an arbitrary pattern.

12. The method of claim 8 wherein placing comprises:

placing the array of nanowires at the distance to the resist ranging from zero to tens of nanometers.

13. The method of claim 9 wherein the first material is an n-type material having a direct bandgap.

14. The method of claim 13 wherein the second material is a p-type material having an indirect bandgap.

15. A system comprising:

a substrate;

a resister layer coated on the substrate; and a mask assembly in close proximity with the resist, the mask assembly comprising:

an array of nanowires placed at a distance to a resist layer, the array forming a plurality of light emitting diodes (LEDs), the distance corresponding to a near field region of light emitted by the LEDs with respect to the resist layer, and a control circuit coupled to the array to control the LEDs to emit the light to pattern a feature in the resist layer.

16. The system of claim 15 wherein the array comprises:

a first plurality of nanowires of a first material having a first size; and a second plurality of nanowires of a second material having a second size and crossing the first plurality of nanowires at cross points, the cross points forming the LEDs.

17. The system of claim 16 wherein the control circuit comprises:

a voltage source to forward bias one of the LEDs at a pre-determined location corresponding to the feature in the resist, the voltage source having a first terminal connected to one of the first plurality of the nanowires and a second terminal connected to one of the second plurality of the nanowires.

18. The system of claim 16 wherein the feature is one of a contact, a via, a line, and an arbitrary pattern.

19. The system of claim 17 wherein the distance ranges from zero to tens of nanometers.

20. The system of claim 16 wherein the first material is an n-type material having a direct bandgap and the second material is a p-type material having an indirect bandgap.

* * * * *